United States Patent [19]

Tokumo et al.

[11] Patent Number: 4,622,691
[45] Date of Patent: Nov. 11, 1986

[54] MOBILE SOUND FIELD CORRECTING DEVICE

[75] Inventors: Akio Tokumo; Yoshiro Kunugi; Toshikazu Yoshimi; Shinjiro Kato; Yoshio Sasaki; Makoto Odaka; Takeshi Sato, all of Saitama, Japan

[73] Assignee: Pioneer Electronic Corporation, Tokyo, Japan

[21] Appl. No.: 739,954

[22] Filed: May 31, 1985

[30] Foreign Application Priority Data

May 31, 1984 [JP] Japan .................. 59-111833

[51] Int. Cl.$^4$ .................................. H04S 1/00
[52] U.S. Cl. ...................... 381/86; 381/103
[58] Field of Search ............... 381/86, 102, 103, 107

[56] References Cited

U.S. PATENT DOCUMENTS 4,320,534 3/1982 Sakai ..................... 381/102

FOREIGN PATENT DOCUMENTS 57-131197 8/1982 Japan ..................... 381/86
57-147399 9/1982 Japan ..................... 381/86
58-133017 8/1983 Japan ..................... 381/107
59-196696 11/1984 Japan ..................... 381/86
59-218100 12/1984 Japan ..................... 381/107

Primary Examiner—Gene Z. Rubinson
Assistant Examiner—L. C. Schroeder
Attorney, Agent, or Firm—Sughrue, Mion, Zinn, Macpeak, and Seas

[57] ABSTRACT

A mobile sound field correcting system for correcting an acoustic characteristic in a vehicle sound field formed by direct waves radiated from loudspeakers and reflected waves thereof providing satisfactory acoustic characteristics for different vehicles and different listening points within a vehicle. A first correcting means corrects a power spectrum of each loudspeaker in a frequency range above a frequency at which a decrease of starts of the power spectrum in a high-frequency range of each loudspeaker. Second correcting means corrects for irregularities in the frequency characteristic of each loudspeaker caused by interference of the direct waves with the reflected waves in a frequency lower than the drop-off frequency of this power spectrum.

11 Claims, 36 Drawing Figures

FIG. 11A-a
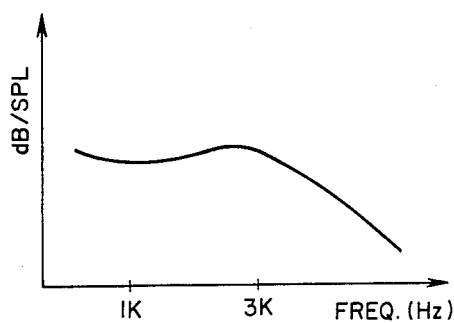
FIG. 11B-a
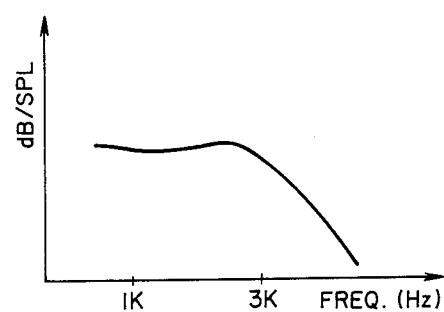
FIG. 11A-b
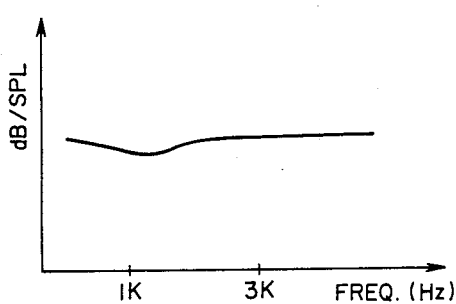
FIG. 11B-b
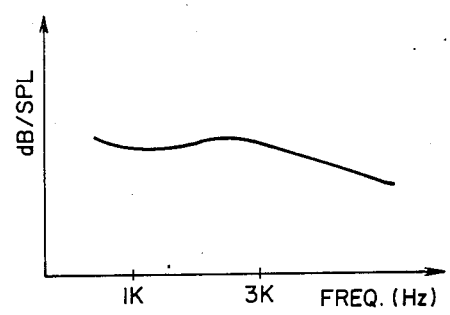
FIG. 11A-c
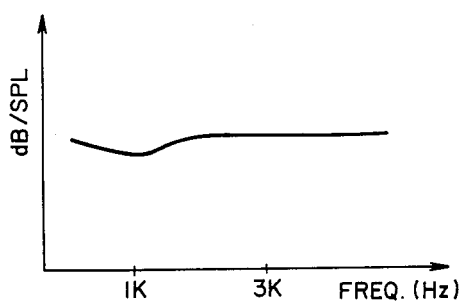
FIG. 11B-c
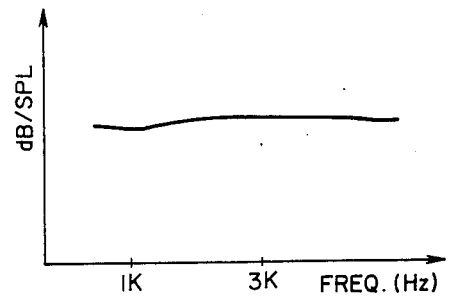

LISTENING POINT

MOBILE SOUND FIELD CORRECTING DEVICE

BACKGROUND OF THE INVENTION

The present invention relates to mobile sound field correcting devices, and more particularly to a mobile sound field correcting device for correcting acoustic characteristics in a sound field in a vehicle formed by a directed wave radiated by a loudspeaker and a reflected wave.

The acoustic wave patterns in a vehicle are significantly different than in a building or home because the sound field is surrounded by reflective surfaces such as glass and metal plates and the sound chamber inside the vehicle is generally small. Further, because the front seat is located substantially at the middle of the vehicle and the rear seat to the rear of the vehicle, the front seat and the rear seat have different acoustic characteristics. Accordingly, the reflected waves arriving at the ears of persons seated in the front and rear seats have different paths and different characteristics. Furthermore, the direct and reflected waves have different travel distances, and therefore the front and rear seats are greatly different in acoustic characteristics such as the sound pressure versus frequency characteristic and sound wave phase characteristic.

Examples of the sound pressure versus frequency characteristic are shown in FIGS. 1A and 1B. FIG. 1A indicates the sound pressure versus frequency characteristic at the front seat in the case where front sound sources (loudspeakers) are installed on the right and left sides of the front doors, and FIG. 1B indicates the sound pressure versus frequency characteristic at the rear seat in the case where rear sound sources are installed on the parcel tray.

Accordingly, even if loudspeakers which exhibit excellent characteristics in an anechoic room are installed in a vehicle, it is impossible to obtain a flat frequency characteristic in the vehicle. Therefore, a frequency characteristic varying device is inserted in the reproduction system of the mobile acoustic device to correct for the irregularities in the frequency characteristic.

An example of the reproduction system of a mobile acoustic device is shown in FIG. 2. In FIG. 2, an audio signal from a signal source 1 such as a tuner or a cassette deck is amplified by an amplifier 2 and is then applied to a frequency characteristic amplifier 3. The output of the amplifier 3, after being subjected to power amplification by a loudspeaker drive signal to a loudspeaker 5.

In the above-described circuit, the audio signal from the signal source is amplified by the amplifier 2 and applied to the amplifier 3, which may be a graphic equalizer or bass/treble tone control, to have a desired frequency characteristic, as determined by the characteristics of the space in which the system is being employed, and then applied as the loudspeaker drive signal.

With the mobile acoustic system, sound waves radiated from a loudspeaker 5 reach a listening point 6 in a sound field as shown in FIG. 3. More specifically, a direct wave from the loudspeaker advances along a path 7 (indicated by a solid line 7) to the listening point 6, and a reflected wave reflected by a wall or the like in the vehicle advances along a path 8 (indicated by dotted lines 8) to reach the listening point 6. In this case, the direct wave and the reflected wave interfere with each other at the listening point 6 so that peaks and dips occur at certain frequencies, and hence the frequency characteristic at the listening point 6 is made irregular.

The reason why peaks and dips occur in the frequency characteristic will be briefly described.

If it is assumed that, in FIG. 3, the length of the direct wave path 7 to the listening point 6 is represented by $l_1$, the length of the reflected wave path 8 to the listening point 6 is represented by $l_2$, and the sound velocity is represented by c, then a sound wave $S_M$ at the listening point 6 is the sum of the direct wave $S_S$ and the reflection wave $S_R$.

$$S_M = S_S + S_R \tag{1}$$
$$= (A/l_1)e^{j\omega(t-l_1/c)} + (KA/l_2)e^{j\omega(t-l_2/c)},$$

where K is the reflection factor of an internal wall or the like and A is the signal strength in the vibration plane of the loudspeaker.

As for the reflected wave $S_R$, in almost all cases it can be considered that the reflections are of the fixed-edge type, and therefore it can be considered that the acoustic impedance is high and that reflections occur in the same phase. (In the case of a free-edge type reflection, the acoustic impedance is small, and $S_M = S_S - S_R$.)

Equation (1) can be rewritten as follows:

$$S_M = (A/l_1)(e^{j\omega(t-l_1/c)} + Be^{j\omega(t-l_2/c)}), \tag{2}$$

where $B = K \, l_1/l_2$.

Assuming that $B=1$ for simplification in description, the frequencies at which peaks occur is:

$$f = nc/(l_1 - l_2), \tag{3}$$

and the frequencies at which dips (troughs) occur is:

$$f = (n + \tfrac{1}{2})c/(l_2 - l_2), \tag{4}$$

where n is an integer.

These equations are graphed in FIG. 4. In practice, $B \neq 1$, and therefore the sound pressure at the dip frequencies cannot be zero. Also, at the peak frequencies, $S_M \neq 2A/l_1$. In FIG. 4, the dotted line indicates the results in the case of free-edge type reflections for the purpose of reference.

As is apparent from the above description, the irregularities in the frequency characteristic due to the interference of the reflected wave are attributed to the difference in travel distance between the two sound waves. Therefore, if the physical arrangement of the device or the listening position is changed, the peak and dip frequencies are changed. To eliminate this difficulty, a number of graphic equalizers can be used, but this increases the system cost. Moreover, it is considerably difficult to adjust such graphic equalizers. Furthermore, in the case of a device which has a bass/treble control function only, it is impossible to fully correct for peaks and dips.

Inside the vehicle, the high-frequency response at the listening point is lowered, in an amount depending on the sound absorption characteristics of interior materials and the installation positions of the loudspeakers, because the attenuation factor and the sound absorption factor generally increase with frequency. The high-frequency characteristic at the front seat is more strong affected than that at the rear seat. This is due to the fact that the rear window is reflective.

Furthermore, inside the vehicle the perceived frequency characteristic is varied by the amount of background noise inside the vehicle. FIG. 5 shows typical spectra of noise inside a vehicle with road conditions and travel speeds varied.

As is apparent from the above description, the acoustic characteristic inside a vehicle varies according to the listening position, the materials of which components inside the vehicle are constructed, and the ambient noise level.

SUMMARY OF THE INVENTION

In view of the foregoing, an object of the present invention is to provide a mobile sound field correcting device which provides a satisfactory acoustic characteristic inside vehicler of different internal configurations and materials.

A specific feature of a mobile sound field correcting system according to the invention resides in that the system comprises: first correcting means for correcting a power spectrum in a frequency range higher than a frequency at which drop-off of a power spectrum in a high-frequency range of each loudspeaker starts; and second correcting means for correcting irregularities in a frequency characteristic caused by interference of direct waves with reflected waves in a frequency range lower than the frequency at which drop-off starts.

BRIEF DESCRIPTION OF THE DRAWINGS

FIG. 11 is a diagram showing the frequency characteristics of original system (a), the frequency characteristics of outputs (b) of first high-frequency range correcting circuits, and the frequency characteristics of outputs (c) of second frequency range correcting circuits for different kinds of vehicles (A) and (B);

DESCRIPTION OF THE PREFERRED EMBODIMENTS

Preferred embodiments of the invention will be described with reference to the drawings.

In accordance with the invention, a mobile acoustic device is provided with four loudspeakers, namely, a pair of loudspeakers installed on the right and left sides of the front seat and a pair of loudspeakers installed on the right and left sides of the rear seat. More specifically, the loudspeakers for the front seat are installed on the right and left front doors or on the dashboard, and the pair of loudspeakers for the rear seat are installed on the right and left rear doors or on the parcel tray.

In general, a loudspeaker unit about 10 cm in diameter used for middle- and high-frequency ranges has a high directivity in the high-frequency range, and the frequency characteristic in the range of from 10° to 30° around the front axis of the speaker is considerably different from that in the range of from 30° to 90°. In addition, the loudspeaker's energy response (i.e., the total energy in a plane including all angles in the radiation space) is similar to the frequency characteristic in the range of 30° to 90°. This is due to the fact that the range of ±30° around the front axis is sufficiently small with respect to all radiation angles.

Accordingly, the difference which occurs in the frequency characteristics in the high-frequency ranges when the listening point is changed is relatively small, except for the angle range of about ±30° around the central axis of the loudspeaker under certain conditions such as in the confined space inside a vehicle. Therefore, if the loudspeaker is installed in such a manner that its central axis is inclined in a range of about 30° to 90° with respect to the listening point (i.e., the position of the ears of person seated in the vehicle), under the condition that the average sound absorption factor is of the order of 0.2 to 0.3 in the ordinary vehicle, the sound field in the vehicle can be made similar to a diffusion sound field above 2 KHz so that the frequency characteristic in the high-frequency range can be made constant, irrespective of the movement of the listening point in the vehicle. This frequency characteristic is substantially equal to the loudspeaker's energy response if the sound absorption factor inside the vehicle is constant, and can be corrected by adjusting the frequency characteristic of the amplifier driving the loudspeaker.

The correction of the frequency characteristic will now be described.

Figure 5:
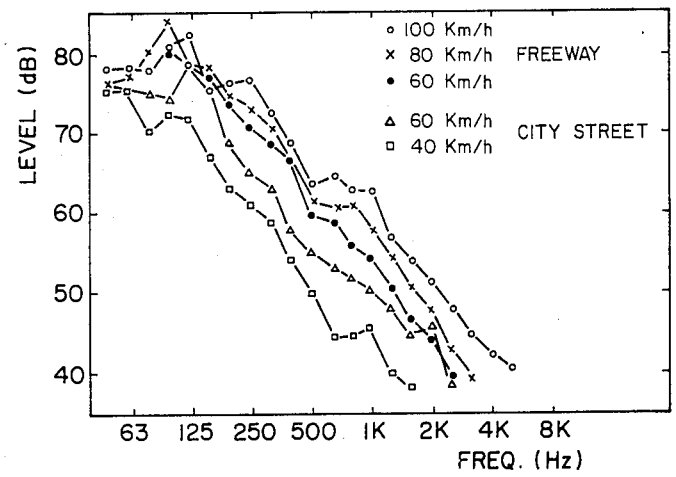
FIG. 5 is a graphical representation indicating spectra of noise in a vehicle varying according to road conditions and travel speed.
Figure 6:
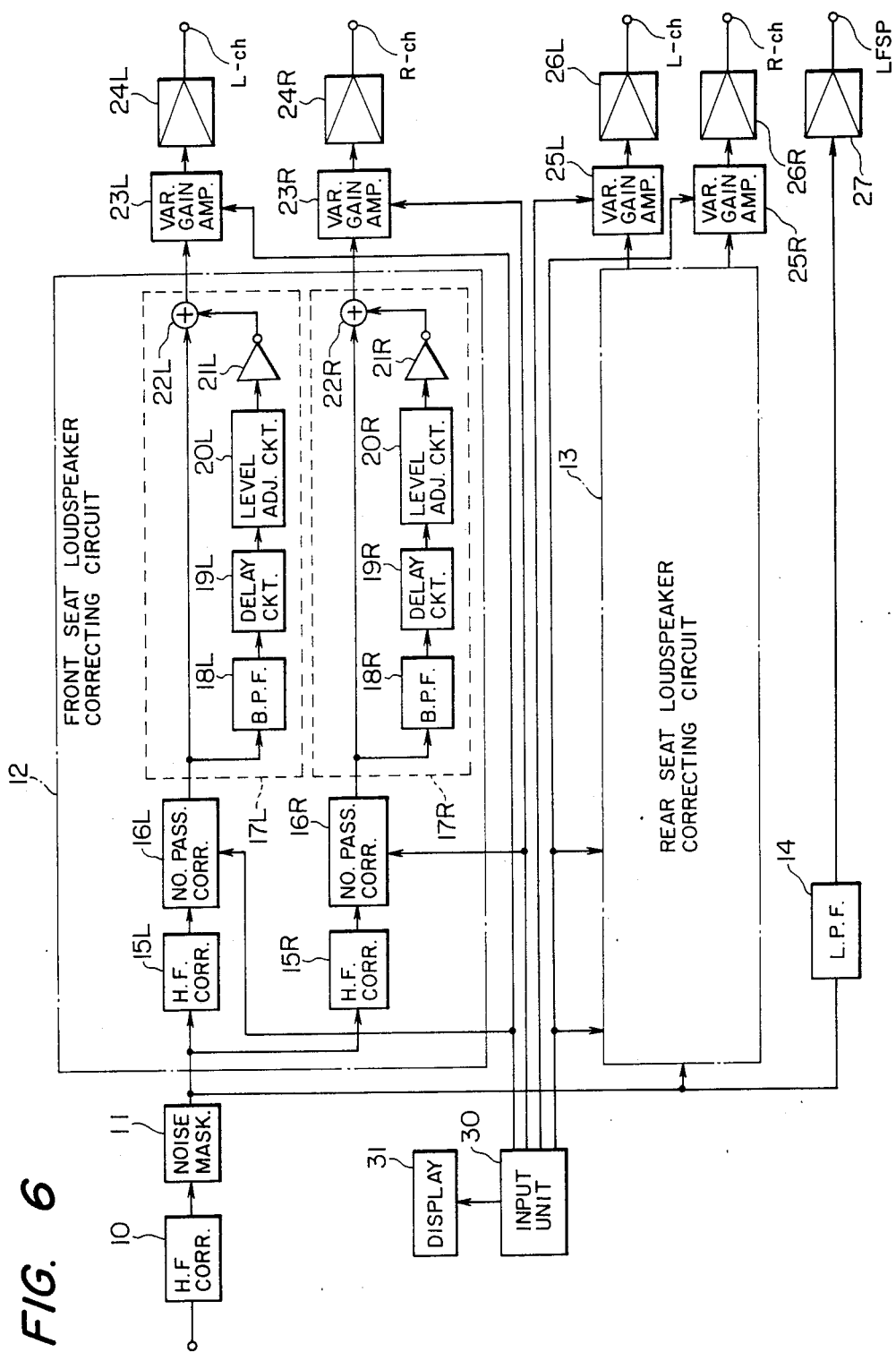
FIG. 6 is a block diagram showing a preferred embodiment of a sound field correcting device of the invention.
Figure 7:
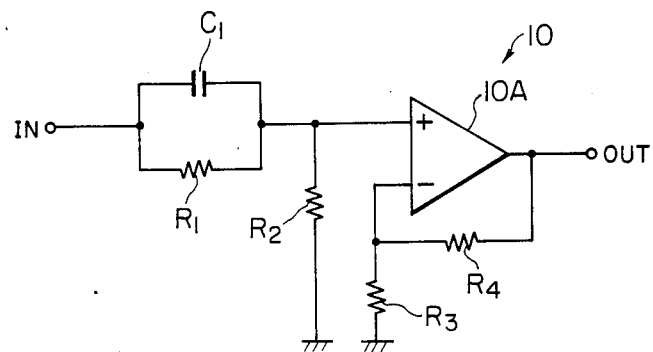
FIG. 7 is a circuit diagram showing an example of a first high-frequency range correcting circuit in FIG. 6.
Figure 8A:
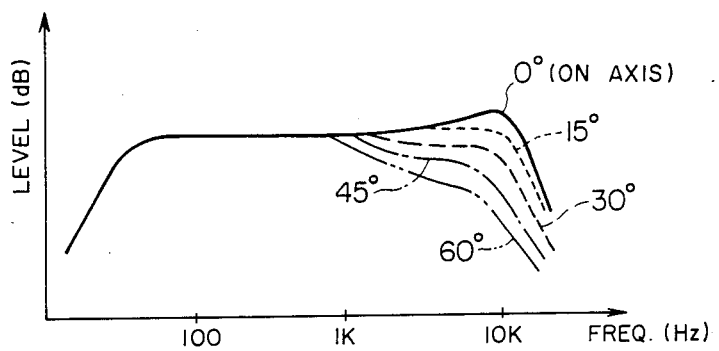
FIG. 8A is a characteristic diagram indicating a loudspeaker's frequency response.
Figure 8B:
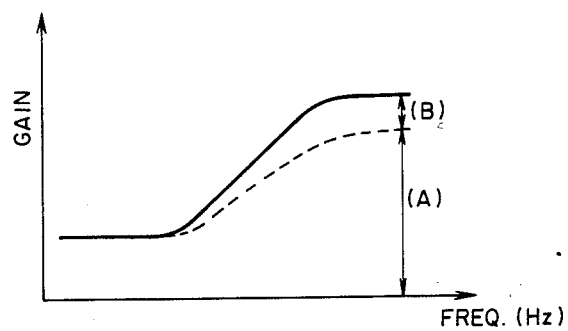
FIG. 8B is a characteristic diagram showing the correction frequency characteristic of the circuit in FIG. 7.
Figure 9:
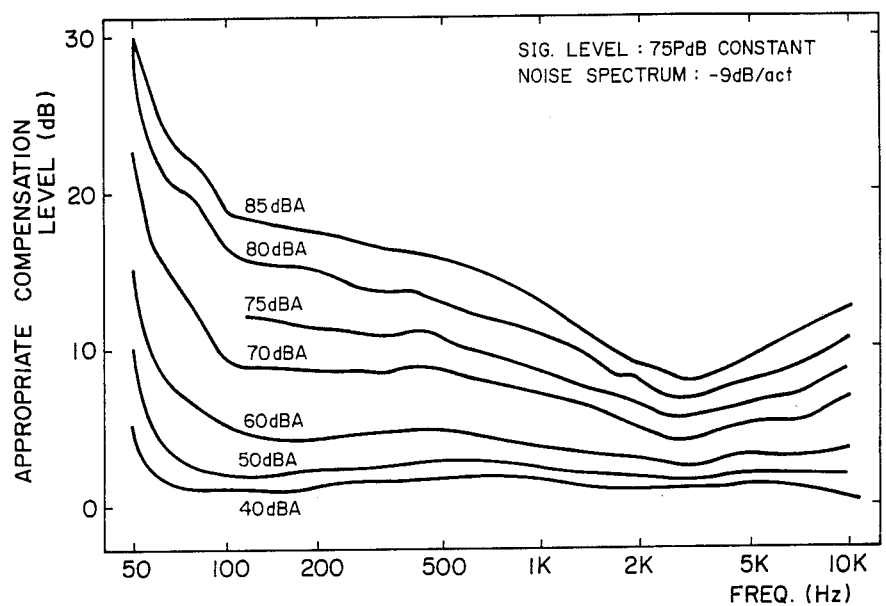
FIG. 9 is a graphical representation indicating frequency characteristics of a noise masking correction circuit in FIG. 6.

As shown in FIG. 6, an audio signal from a signal source is applied through a first high-frequency range correcting circuit 10 and a road noise masking correcting circuit 11 to a front seat loudspeaker correcting circuit 12 and a rear seat loudspeaker correcting circuit 13 and to a low-frequency range loudspeaker low-pass filter 14. The first high-frequency range correcting circuit 10 is a boost circuit adapted to correct for a drop in the loudspeaker's energy response (see FIG. 8A) in the high-frequency portion of the frequency characteristic and a drop of the energy response with the average sound absorption factor inside the vehicle. The circuit 10, as shown in FIG. 7, is composed of a differential amplifier 10A, resistors $R_1$ through $R_4$, and a capacitor $C_1$. The correction frequency characteristic is selected so that, as shown in FIG. 8B, it is opposite to the frequency characteristic including the response drop. In FIG. 8B, reference character (A) designates compensation for the drop of the loudspeaker's inherent energy response, and (B) compensation for the drop of the energy response with the average absorption factor in the vehicle. The noise masking correcting circuit 11 is used to correct the frequency characteristic (see FIG. 5) for the change in auditory perception caused by the masking phenomenon of the ambient noise when the vehicle is moving. That is, the correction is such that characteristic curves as shown in FIG. 9 are obtained.

The front seat loudspeaker correcting circuit 12 has the same construction as the rear seat loudspeaker correcting circuit 13. Therefore, only the correcting circuit 12 will be described in detail. Each of the correcting circuits 12 and 13 has two symmetrical signal systems for the respective right and left loudspeakers, and therefore only one of the signal systems will be described.

Figure 10:
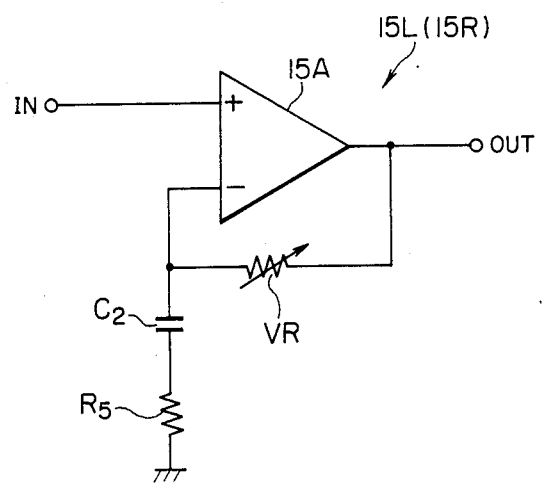
FIG. 10 is a circuit diagram showing an example of a second high-frequency range correcting circuit in FIG. 6.

The correcting circuit 12 has a second high-frequency range correcting circuit 15L (L representing the left channel) and a number-of-passengers correction circuit 16L. The second high-frequency range correcting circuit 15L is a boost circuit (namely, a tone control circuit or the like) which corrects the high-frequency characteristic due to variation among vehicles in sound absorbing materials and accordingly different sound absorption factors. The correcting circuit 15L, as shown in FIG. 10, is made up of a differential amplifier 15A, a resistor $R_5$ a capacitor $C_2$, and a variable resistor VR. In order to compensate for the different characteristics of different vehicles, the variable resistor VR is adjusted to establish an appropriate correction characteristic. The second high-frequency range correcting circuit 15L and the first high-frequency range correcting circuit 10 form a first correcting unit which corrects the power spectrum in the frequency range which is higher than the frequency at which the power spectrum of the loudspeaker, on the side of the high-frequency range, starts to decrease. The two circuits cooperate to correct the overall frequency characteristic in the vehicle in such a manner that it is flat substantially over the entire frequency range.

Different vehicles have different sound pressure versus frequency characteristics, as shown, for instance, in FIGS. 11A-a to 11B-c. As shown in FIGS. 11A-a and 11B-a, in the case of a vehicle A (FIG. 11A-a), the characteristic curve drops relatively slightly in the high-frequency range, but in the case of a vehicle B (FIG. 11B-a), the characteristic curve drops relatively greatly in the high-frequency range.

The high-frequency range corrections of these vehicles will now be considered. In the case of the vehicle A, as shown in FIG. 11A-b, the characteristic can be corrected and made substantially flat merely by the operation of the first high-frequency range correcting circuit 10 having the fixed correction characteristic, and therefore a flat sound pressure versus frequency characteristic as shown in the FIG. 11A-c can be obtained, even if no correction is performed by the second high-frequency range correcting circuit 15L. On the other hand, in the case of the vehicle B, the operation of the first high-frequency range correcting circuit 10 is not adequate for the correction (see FIG. 11B-b), and therefore boost correction must be carried out by the second high-frequency range correcting circuit 15L to obtain a flat sound pressure versus frequency characteristic, as shown in FIG. 11B-c.

As is apparent from the above description, the second high-frequency range correcting circuit 15L is provided to compensate for the different sound pressure versus frequency characteristics in different vehicles. It goes without saying that the correcting circuit 15L is provided with an input section (not shown) used select correction characteristics according to the type of vehicle. In the correcting circuit 15L, the variable resistor VR (FIG. 10) is adjusted according to the input data.

The number-of-passengers correction performed by the number-of-passengers correction circuit 16L will be described below.

The output signal of the number-of-passengers correction circuit 16L is applied to second correcting unit, namely, a peak/dip correcting circuit 17 used to correct for the irregularities in the frequency characteristic caused by interference of a direct wave radiated from the loudspeaker with the reflected waves inside the vehicle. In the case where, in the peak/dip correcting circuit 17L, the input signal applied thereto is an original signal, the original signal is applied to a bandpass filter 18L whose passband is one in which peaks and dips occur. The output of the bandpass filter 18L is applied to a delay circuit 19L where it is delayed so as to produce therein peak and dip frequencies. The output of the delay circuit 19L is subjected to level adjustment by a level adjusting circuit 20L so that the peak and dip levels are corrected. The level-adjusted signal is subjected to phase inversion by a phase inverter 21L. The output of the inverter 21L is added to the original signal by an adder 22L. The output of the adder 22L is applied through a variable gain unit 23L to a power amplifier 24L, the output of which is employed as a left (L) channel loudspeaker drive signal.

Figure 3:
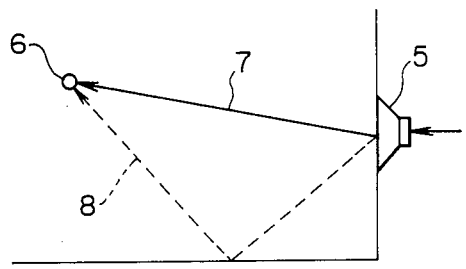
FIG. 3 is a diagram showing a direct wave and a reflected wave in a sound field.
Figure 4:
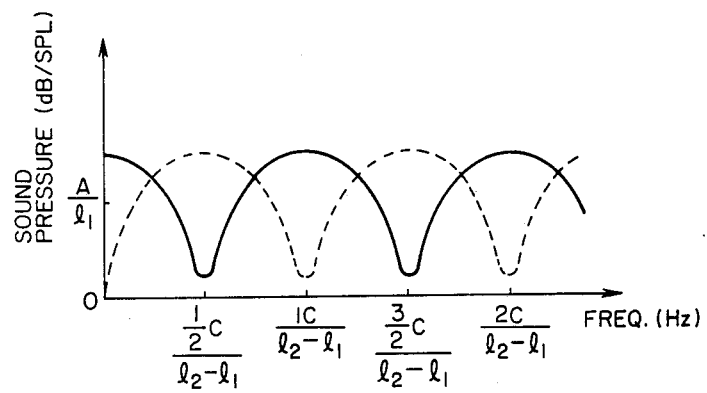
FIG. 4 is a graphical representation indicating a sound pressure versus frequency characteristic at a listening point.

It is assumed that, in the sound field shown in FIG. 3, reflecting objects effect fixed-edge type reflections. If the original signal $S_I$ is represented by $Ae^{j\omega t}$, the delay time by the delay circuit 19L is represented by $-(I_2-I_1)/c$, and the adjustment level established by the level adjusting circuit 20L is represented by $KA \cdot I_1/I_2$, then the output signal $S_D$ of the level adjusting circuit 20L is:

$$S_D = -(KA \cdot I_1/I_2)e^{j\omega(t-(I_2-I_1)/c)}. \tag{5}$$

Therefore, the output $S_O$ of the adder 22L is:

$$S_O = S_I + S_D \tag{6}$$

$$= Ae^{j\omega t} - (KA \cdot I_1/I_2)e^{j\omega(t-(I_2-I_1)/c)}.$$

Figure 1A:
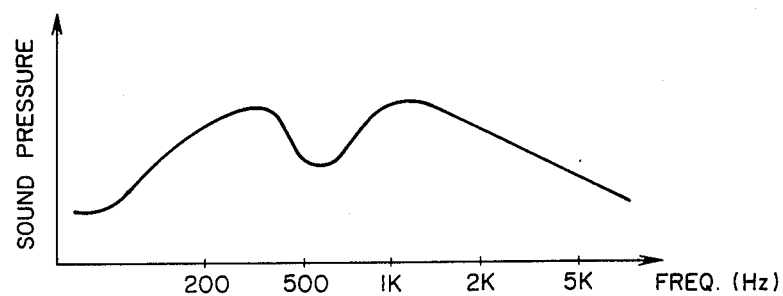
FIG. 1A is a characteristic diagram showing a sound pressure versus frequency characteristic at the front seat in a vehicle.
Figure 1B:
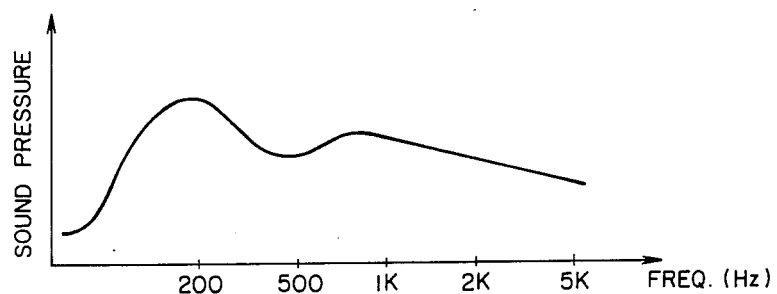
FIG. 1B is also a characteristic diagram showing a sound pressure versus frequency characteristic at the rear seat in the vehicle.
Figure 2:
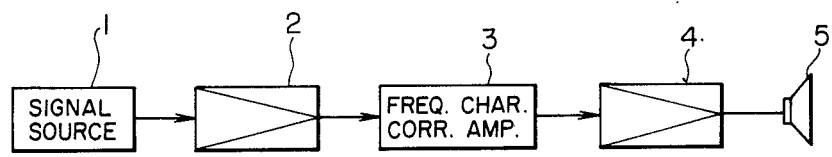
FIG. 2 is a diagram showing the arrangement of an example of a reproduction system in a mobile acoustic device.

Since the signal $S_O$ is applied to the loudspeaker, the sound wave $S_M$ at the listening point 6 in FIG. 2 can be represented by the following expression:

$$S_M = (A/I_1)e^{j\omega(t-I_1/c)} - \tag{7}$$

$$(KA/I_2)e^{j\omega(t-(I_2-I_1)/c-I_1/c)} +$$

$$(KA/I_2)e^{j\omega(t-I_2/c)} -$$

$$(K/I_2)(KA \cdot I_1/I_2)e^{j\omega(t-(2I_2-I_1)/c)}.$$

$$= (A/I_1)e^{j\omega(t-I_1/c)} - (K^2A \cdot I_1/I_2^2)e^{j\omega(t-(2I_2-I_1)/c)}.$$

In the expression (7), the second term is much smaller than the first term. Therefore, $$S_M = (A/I_1)e^{j\omega(t-I_1/c)}. \tag{8}$$

Thus, the reflected wave can be eliminated.

In the above-described embodiment, the delay time of the delay circuit 19L is fixed in conformance with the path lengths $I_1$ and $I_2$ of the sound waves in FIG. 2. However, in practice, the sound field is infinite in space and there are an infinite number of sound wave paths. Therefore, the delay time and the level adjustment should be made variable.

Next, the number-of-passengers correction circuit 16L for correcting the output characteristic of the loudspeaker according to the number of passengers seated in the vehicle will be described.

Figure 12:
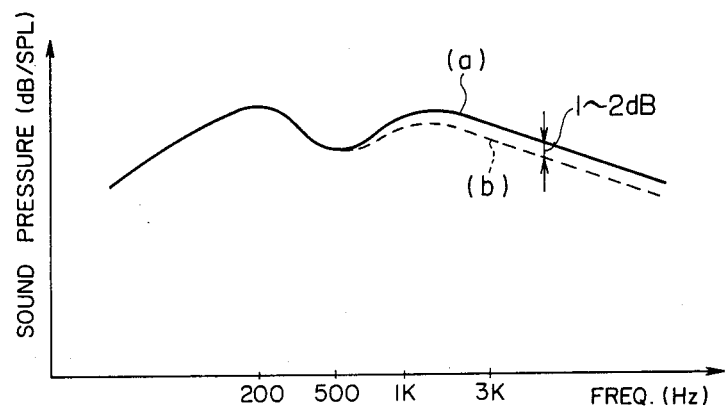
FIG. 12 is a frequency characteristic diagram showing how the sound pressure level in the high-frequency range is decreased as the number of persons is increased in the vehicle.

It is assumed that the best acoustic characteristic is obtained when, in the case where a pair of loudspeakers for the front seat are installed on the front doors, only one person is present in the vehicle. If, under this condition, the number of persons seated on the front seat is increased, then the sound waves from the loudspeakers are disturbed by the persons near the loudspeakers. Furthermore, a clothed human body has a high sound absorption factor for middle- and high-frequency ranges. Therefore, as the number of persons in the vehicle increases, the sound pressure level decreases from the optimum listening level (the solid line (a) in FIG. 12) by about 1 to 2 dB in the middle- and high-frequency ranges (above about 1 KHz) as indicated by the broken line (b) in FIG. 12. Therefore, in response to input data from the inputting device 30 which indicates the fact that there are a plurality of persons in the vehicle, the number-of-passengers correction circuit 16L performs a correcting operation of increasing the sound pressure level of the loudspeakers by about 1 and 2 dB in the middle- and high-frequency ranges (above about 1 KHz). The correction of the middle- and high-frequency ranges is carried out not only for the left channel but also for the right channel. That is, in response to the output from the inputting unit 30, the two correction circuits 16L and 16R operate in the same manner. Thus, even when the number of persons in the vehicle changes, a flat frequency characteristic is obtained.

Figure 13:
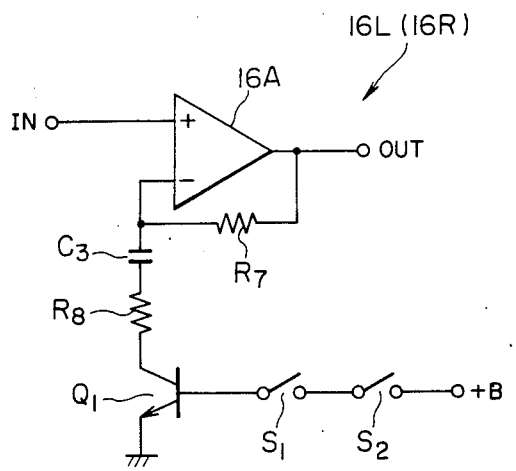
FIG. 13 is a circuit diagram showing an example of a number-of-passengers correction circuit 16L (16R) in FIG. 6.

The number-of-passengers correction circuit 16L (16R), as shown in FIG. 13, is composed of a differential amplifier 16A, resistors $R_7$ and $R_8$, a transistor $Q_1$, and, for instance, two switches $S_1$ and $S_2$ corresponding to the two seats. In this circuit, only when the two switches $S_1$ and $S_2$ are turned on at the same time, the transistor $Q_1$ is rendered conductive to permit the correction of the frequency characteristic. The inputting unit 30, which supplies control signals to turn on and off the switches $S_1$ and $S_2$, will be described below in more detail. Moreover, correction is carried out also for the rear seat; that is, the loudspeaker sound pressure level in the middle- and high-frequency ranges is corrected in the same manner in response to a change in the number of persons in the vehicle.

Figure 14:
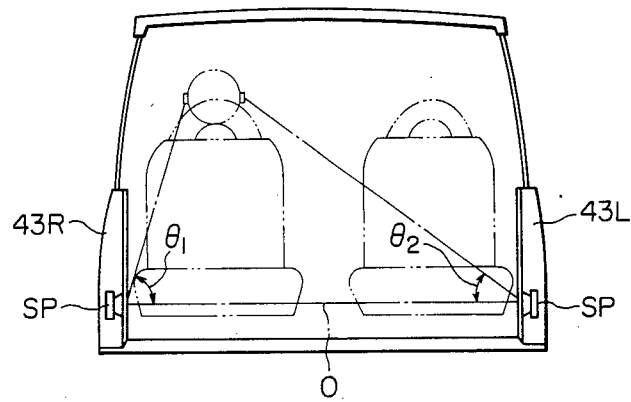
FIG. 14 is a diagram indicating positional relationships between a listening point and a pair of loudspeakers installed on the right and left front doors.
Figure 29:
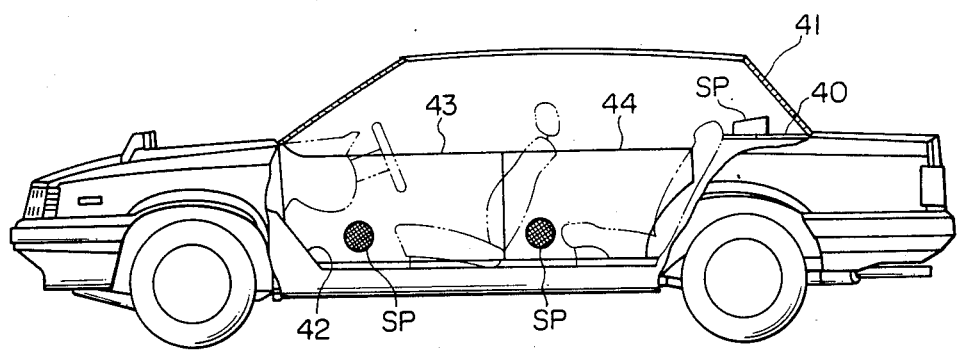
FIG. 29 is a diagram showing the positions of loudspeakers installed in a vehicle.

The case will now be considered where a loudspeaker SP is installed on a front door 43 as shown in FIG. 29. In this case, the installation position is generally limited to the lower part of the door 43 because of the overall structure of the door; that is, the loudspeaker is installed unavoidably close to the feet of the person in the vehicle. Accordingly, the sound radiated from the loudspeaker is interrupted by the feet and the body of the person and by the seat, thus being attenuated and absorbed thereby. On the other hand, as shown in FIG. 14, the angle $\theta_1$ formed between a line connecting the center of a loudspeaker on the right front door 43R closer to the person or driver and the listening point and/(the ear of the person) and the line 0 connecting the centers of the two loudspeakers is much larger than the angle $\theta_2$ at the loudspeaker on the left front door 43L. As a result, because of the directional pattern of the loudspeakers, the sound pressure level of the loudspeaker on the left front door is higher than that of the loudspeaker on the right front door, and thus the sound image tends to shift towards that loudspeaker that is, the sound image localization is changed, and a satisfactory stereo characteristic cannot be obtained. In order to normalize the sound image localization, in response to seating information received from the inputting unit 30, the output level of the loudspeaker closer to the listening point is increased. As a result, the loudspeaker output levels on the right and left of the listening point are made substantially equal to each other. Thus, although the right and left loudspeakers are not symmetrical in position with respect to the listening point, a satisfactory stereo characteristic is obtained.

It has been found through measurements that good results can be obtained by increasing the output level of the loudspeaker closer to the listening point by about 2 to 5 dB. In the case where a plurality of persons are in the vehicle, the sound pressure level of the loudspeaker closer to the listening point is decreased (restored), or the output level of the loudspeaker farther from the listening point is increased until the right and left loudspeakers become equal in sound pressure level.

The variable gain unit 23L or 23R may be a conventional one if it can be switched in two steps according to whether only one person is in the vehicle or a plurality of persons are in the vehicle. The above-described correction is effective not only in the case where the loudspeakers are installed on the front doors but also in the case where the loudspeakers are installed on the dashboard. When, in the latter case, the sound pressure level of the loudspeaker closer to the listening point is lower, then correction can be carried out in the same manner.

The case will be considered where, as shown in FIG. 29, loudspeakers SP are installed on the parcel tray 40. In this case, these loudspeakers are closer to the listening point than those at the front seat, and they are directed towards the listening point. Therefore, the sound pressure level of the loudspeaker closer to the listening point is higher, and the sound image is shifted towards that loudspeaker. Therefore, in contrast to the case of the front seat, the output level of the loudspeaker closer to the listening point is decreased by the variable gain unit 25L or 25R to make the sound image localization normal for a satisfactory stereo characteristic.

Figure 15:
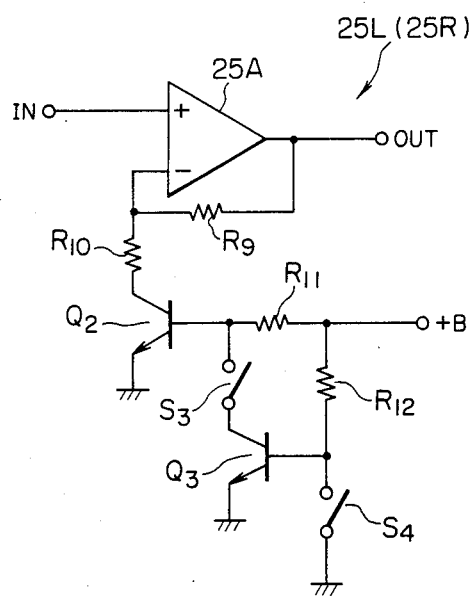
FIG. 15 is a circuit diagram showing a variable gain unit 25L (25R) in FIG. 6.
Figure 16:
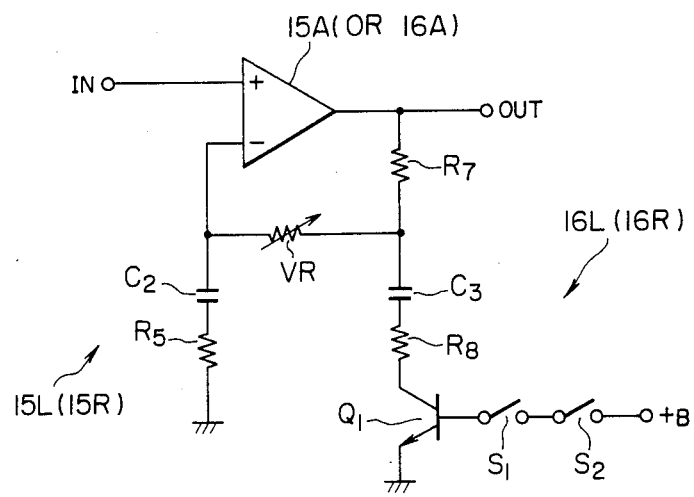
FIG. 16 is a circuit diagram showing an example of a circuit which is obtained by combining the first high-frequency range correcting circuit and the number-of-passengers correction circuit for the front seat shown in FIG. 6.
Figure 17:
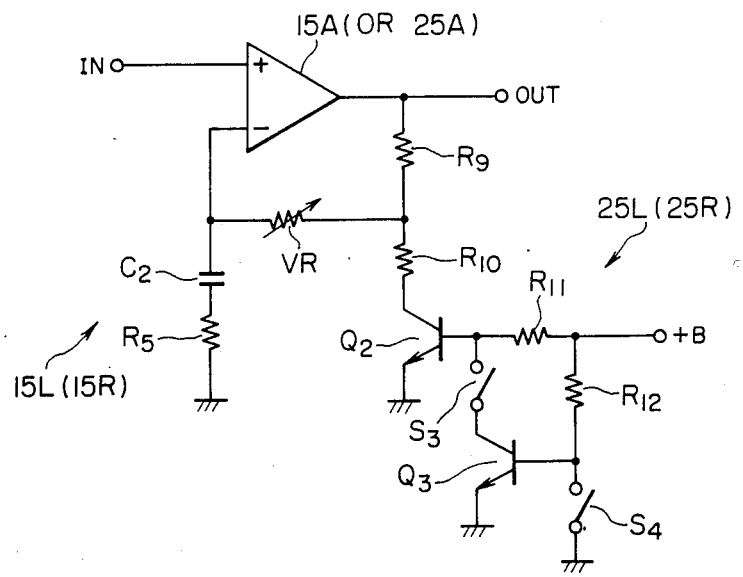
FIG. 17 is a circuit diagram showing an example of a circuit which is obtained by combining the first high-frequency range correcting circuit and the variable gain unit for the rear seat shown in FIG. 6.

The variable gain unit 25L (or 25R), as shown in FIG. 15, is composed of a differential amplifier 25A, transistors $Q_2$ and $Q_3$, resistors $R_9$ through $R_{12}$, and, for instance, two switches $S_3$ and $S_4$ corresponding to the number of seats. It is assumed that this circuit is the left-channel variable gain unit 25L, and the switches $S_3$ and $S_4$ are provided for the left and right seats, respectively. When only the left seat is occupied, in response to the seating information received from the inputting unit 30 the switch $S_3$ is turned on, as a result of which the transistor $Q_3$ is rendered conductive while the transistor $Q_2$ is rendered nonconductive, and therefore the output level of the left-channel loudspeaker only is decreased. When the right seat is also occupied, the switch $S_4$ is also turned on, as a result of which the transistor $Q_3$ is rendered nonconductive and the transistor $Q_2$ conductive. Therefore, the output level of the left-channel loudspeaker is restored so that the sound pressure levels of the right and left loudspeakers are made equal to each other.

It has been found through experiments that satisfactory results can be obtained by decreasing the level in a range of 2 to 5 dB. In the case where the loudspeakers SP are installed on the rear doors as shown in FIG. 29, the results are satisfactory when the level is decreased in the range of 3 to 6 dB. When a plurality of persons occupy the rear seat, the output level of the loudspeaker, the output level of which has been decreased, may be restored as described before; however, by increasing the output level of the loudspeaker more remote from the listening point, the right and left loudspeakers can be made equal in sound pressure level. When a person is seated substantially at the middle of the rear seat, the right and left sides are acoustically balanced, and therefore no correction is necessary.

As was described with reference to the front seat, the second high-frequency range correcting circuit 15L (15R) shown in FIG. 10 is separated from the number-of-passengers correction circuit 16L (16R). However, the two circuits can be combined into a single unit with the differential amplifier 15A (16A) used as a common circuit, with the result that the number of components and accordingly, the manufacturing cost, is reduced.

Also, the circuit is simplified. Furthermore, as was described with reference to the case of the rear seat, the variable gain unit 25L (25R) is an independent circuit. However, it may be combined with the sound high-frequency range correcting circuit with the differential amplifier 15A (or 25A) used as a common circuit. This provides substantially the same effects as those in the combination of the second high-frequency range correcting circuit and the number-of-passengers correction circuit.

Next, the inputting unit 30 will be described in detail. The inputting unit 30 is used to input the number of persons on each of the front and rear seats. The inputting unit 30 may be so designed that a plurality of switches corresponding to the number of seats are provided at the operating section, and the switches thus provided are manually operated to input the number of persons in the vehicle, or it may be so designed that switches are automatically operated when the respective seats are occupied by persons so as to automatically input the number of persons in the vehicle.

The inputting unit 30 provides the input data on how the seats are occupied, as described above. The input data is displayed on a display unit 31 implemented with a plurality of display elements such as light-emitting diodes provided in correspondence to the seats. In order that the positions of the persons in the vehicle can be detected at a glance, the arrangement of the display element is, for instance, the same as that of the seats. In the display unit 31, the occupation of the seats is indicated by alternating colors, by allowing each display element to flicker, or by changing the luminance of each display element.

Figure 18:
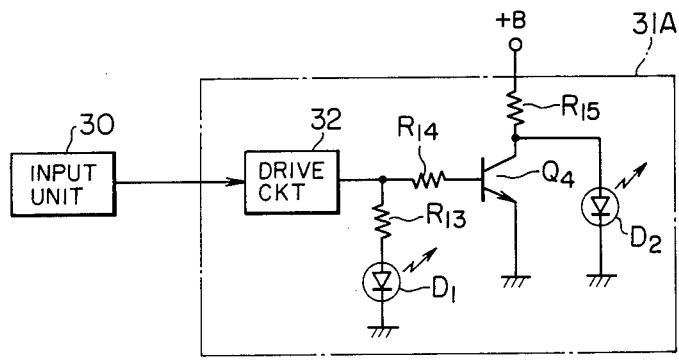
FIGS. 18 through 20 are circuit diagrams showing examples of a display unit in FIG. 6.
Figure 19:
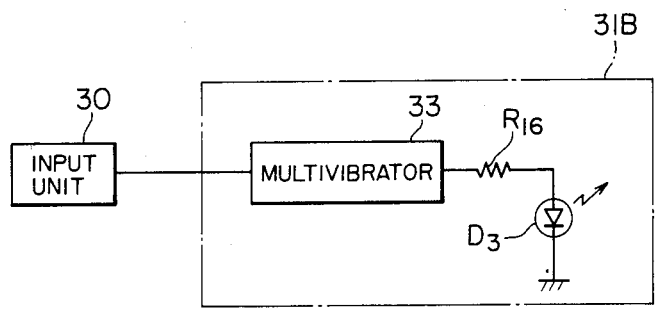
Figure 20:
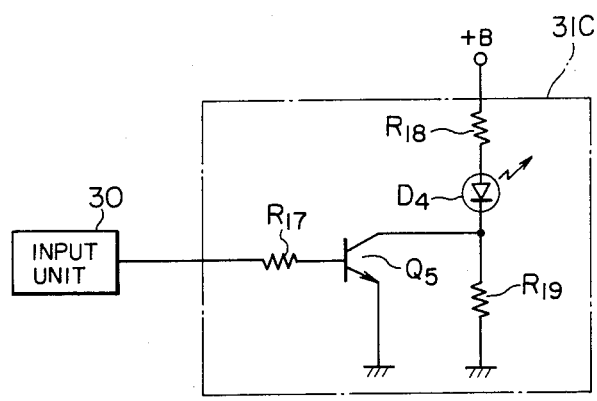
Figure 21:
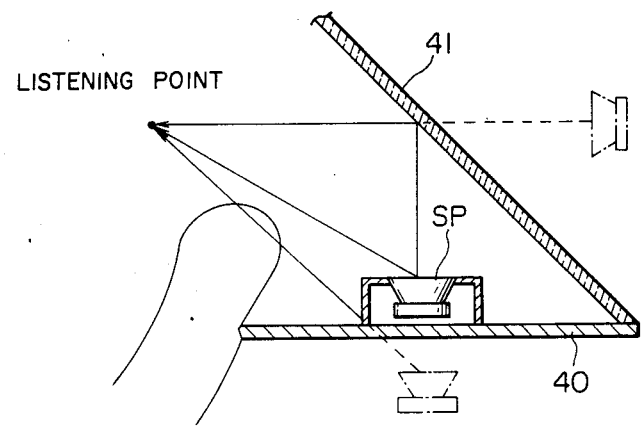
FIG. 21 is a diagram used for explaining the principle of the mirror image effect in the case where a loudspeaker is installed on the rear parcel tray.

Specific examples of the display units are as shown in FIGS. 18, 19 and 20. Display unit 31A, which displays the occupation of a seat by color alternation, as shown in FIG. 18, includes a drive circuit 32 which operates according to input data from the inputting unit 30, two light-emitting diodes $D_1$ and $D_2$ different in luminescent color which are provided for one seat, resistors $R_{13}$ through $R_{15}$, and a transistor $Q_4$. Usually, the output of the drive circuit 32 is at low level and the light-emitting diode $D_2$ emits light. Therefore, when the corresponding switch is turned on in the inputting unit 30, the output of the drive circuit 32 is raised to a high level so that the light-emitting diode $D_1$ emits light while the transistor $Q_4$ is rendered conductive to turn off the light-emitting diode $D_2$. Display unit 31B, which causes the display element to flicker, as shown in FIG. 19, includes a multivibrator 33 triggered by the output of the inputting unit 30, a resistor $R_{16}$, and a light-emitting diode $D_3$. In the display unit 31B, the light-emitting diode $D_3$ is caused to flicker with a period determined by the multivibrator 33. A display unit for displaying the occupation of a seat by changing the luminance of the display element, as shown in FIG. 20, includes a transistor controlled by the output of the inputting unit 30 which is applied through a resistor $R_{17}$, a diode $D_4$, and resistors $R_{18}$ and $R_{19}$. Normally, the transistor $Q_5$ is maintained nonconductive, and a small current determined by the resistors $R_{18}$ and $R_{19}$ flows in the light-emitting diode $D_4$, and therefore the light emitted by the light-emitting diode $D_4$ is at low luminance. In response to the output of the inputting unit 30, the transistor $R_{17}$ is rendered conductive to short-circuit the resistor $R_{19}$, as a result of which the current flowing in the diode $D_4$ is increased and its luminance is also increased.

As described above, the transmission characteristic curve at the rear seat is raised in the low-frequency range compared with that at the front seat because of the structure, etc., inside the vehicle so that the low-frequency range of the reproduced sound is strongly emphasized. One cause for this is as follows: If the loudspeaker SP is installed on the rear parcel tray, the loudspeaker SP is surrounded by two surfaces, the rear parcel tray 40 and the rear glass window 41. Therefore, it can be considered that, because of mirror image effects with respect to the two surfaces, the effective power in the low-frequency range is higher than that in the middle- and high-frequency ranges.

Figure 22:
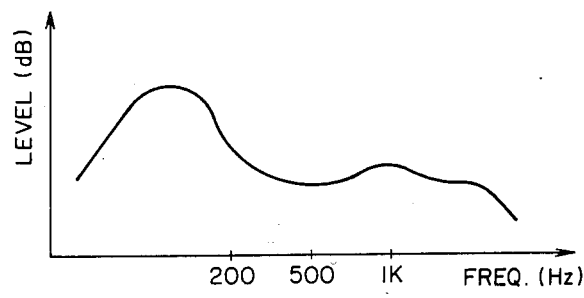
FIG. 22 is a diagram showing a frequency characteristic at the rear seat in the case where a loudspeaker is installed on the rear parcel tray.
Figure 23:
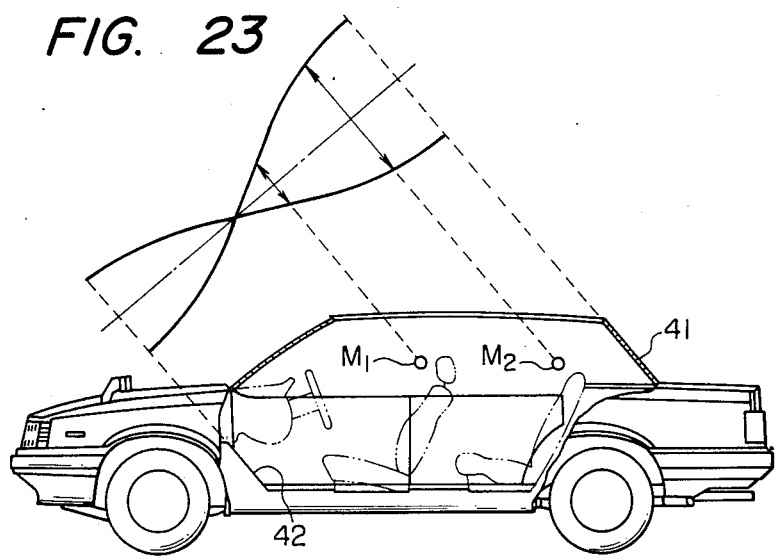
FIG. 23 is a diagram indicating a standing wave distribution inside a vehicle in the case where the low-frequency range is not cut off.
Figure 24:
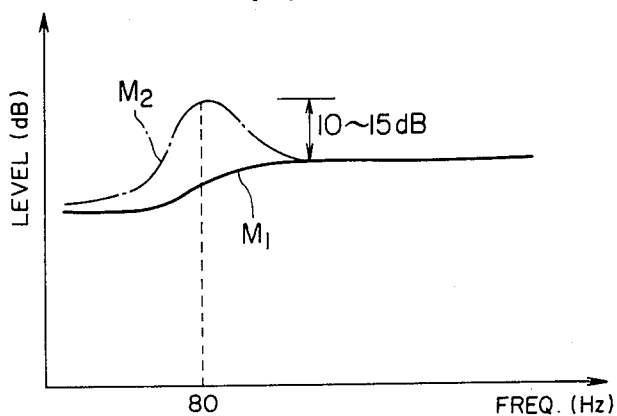
FIG. 24 is a diagram showing the frequency characteristic for the case of FIG. 23.

In the case where the loudspeaker is installed on the rear parcel tray 40, the frequency characteristic at the rear seat is as shown in FIG. 22. The standing wave distribution inside the vehicle is as shown in FIG. 23. The lengths of arrows at the listening points $M_1$ and $M_2$ indicate the sound pressure at the frequencies at which the standing waves are formed. This can be represented by a frequency characteristic as shown in FIG. 24. As is apparent from FIG. 24, the sound pressure level at the listening point $M_1$ is higher by about 10 to 15 dB than that at the listening point $M_2$. The listening points $M_1$ and $M_2$ correspond to the positions of the ears of a seated person. In FIG. 23, reference numeral 41 designates the rear window glass, and 42, the foot board.

Figure 25:
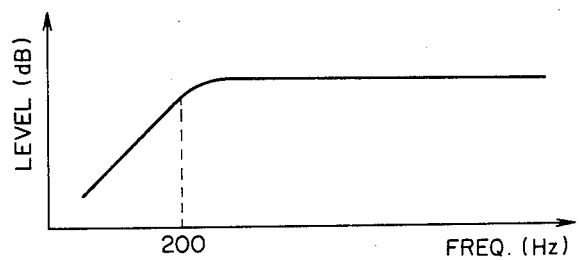
FIG. 25 is a diagram indicating the frequency characteristic of a power amplifier for the rear seat.

If, in the case where four loudspeakers are installed in the vehicle (two loudspeakers on the right and left sides of the front seat and the other two loudspeakers on the right and left sides of the rear seat as in the above-described embodiment), the low-frequency range in the output characteristic of each of the loudspeakers installed on both sides of the rear seat is cut off so that the person on the rear seat is allowed to hear low-frequency sounds through the low-frequency components which are reproduced by the loudspeakers on both sides of the front seat, then that person can hear reproduced sounds which are satisfactory in quality with the sound pressure level in the low-frequency range not being increased. As is apparent from the frequency characteristic shown in FIG. 22, the low-frequency range cut-off frequency is preferably about 200 Hz. Cutting off the low-frequency range in the output characteristic of the loudspeaker at the rear seat can be achieved by converting the frequency characteristic of the power amplifier 26L (26R) in the signal system for the rear seat into that shown in FIG. 25.

Figure 26:
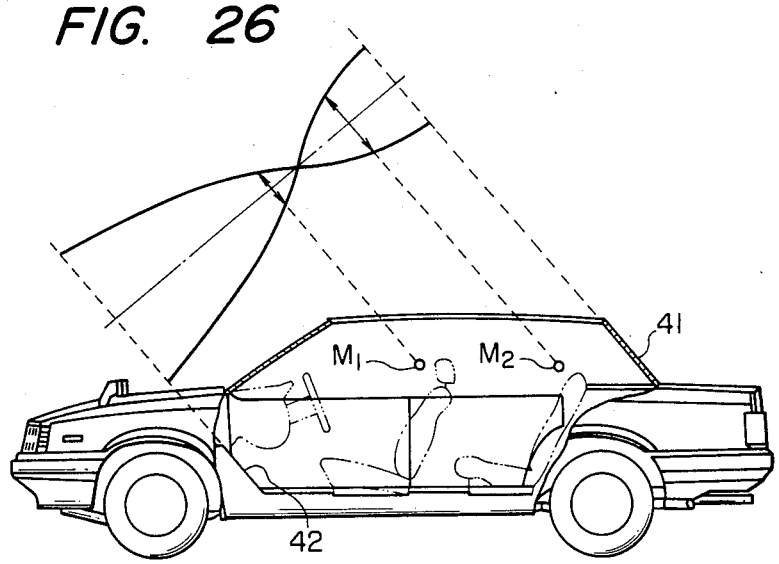
FIG. 26 is a diagram indicating a standing wave distribution inside a vehicle in the case where the low-frequency range is cut off.
Figure 27:
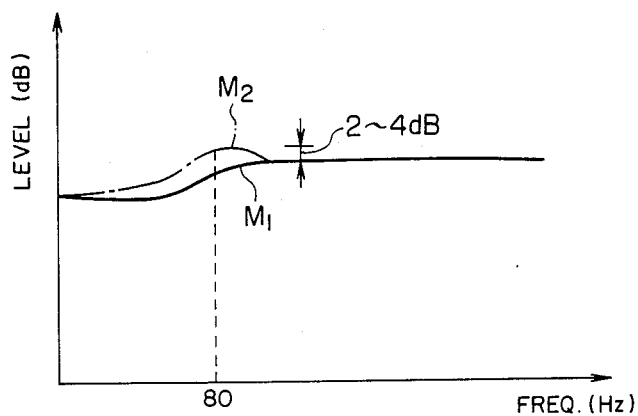
FIG. 27 is a diagram showing the frequency characteristic corresponding to the case of FIG. 26.

FIGS. 26 and 27 indicate the frequency characteristics at the listening points $M_1$ and $M_2$ in the vehicle when the low-frequency range in the output characteristic of each loudspeaker at the rear seat is cut off. A sound pressure distribution due to the standing waves inside the vehicle is observed, but the sound pressure distributions at the listening points $M_1$ and $M_2$ are remarkably improved, and therefore sound reproduction can be satisfactorily effected both at the front seat and at the rear seat.

Figure 28:
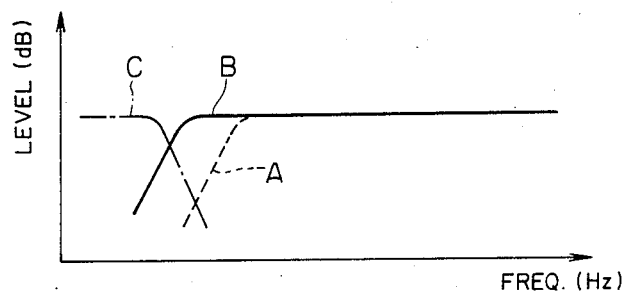
FIG. 28 is a diagram indicating the frequency characteristics of a power amplifier for the rear seat, of a power amplifier for the front seat, and of a power amplifier for low-frequency sound.

In the case of a multi-way system obtained by adding a low-frequency sound speaker (not shown) driven through a power amplifier 27 by the output of a low-pass filter 14 in FIG. 6, the crossover frequency of the low-frequency range speaker and a middle- and high-frequency range speaker is determined together by the loudspeakers at the front seat and the low-frequency range speaker, and, as for the loudspeakers at the rear seat, the low-frequency range is cut off at a suitable frequency so that a satisfactory acoustic characteristic is obtained. In FIG. 28, reference character (A) designates the frequency characteristic of the power amplifier 26L (26R) for the rear seat; (B), the frequency characteristic of the power amplifier 24L (24R) for the front seat; and (C), the frequency characteristic of the power amplifier 27 for low-frequency sound.

In the above-described embodiment, the power amplifier 26L (26R) for the rear seat electrically cuts off the low-frequency range. However, it goes without saying that the same effect can be obtained by acoustically modifying the loudspeaker units for the rear seat, i.e., by decreasing the size of the speaker boxes or by increasing the lowest resonance frequency $f_0$ thereof.

As is apparent from the above description, the hegh-frequency acoustic characteristic and the irregularities in the frequency characteristic caused by the interference of the direct wave and the reflected wave are corrected. Therefore, the mobile sound field correcting system according to the invention can obtain a satisfactory acoustic characteristic at all times, even for different vehicles or different listening points.

Moreover, according to the invention, the high-frequency acoustic characteristic in the vehicle sound field and irregularities in the frequency characteristic caused by the reflected waves are corrected. Furthermore, the output characteristics of the loudspeakers are corrected according to variations in the number of persons in the vehicle, and the sound masking phenomenon caused by the ambient noises of the vehicle is also corrected according to the invention. Therefore, the mobile sound field correcting system according to the invention provides a satisfactory acoustic characteristic at all times, even for different vehicles and different listening points. Also, sound masking caused by the ambient noise in the vehicle is reduced.

Further, as is apparent from the above description, according to the invention, a fixed correcting means having a correction characteristic established according to the intrinsic characteristic of the loudspeaker and variable correcting means having a variable correction characteristic correct the decrease in the high-frequency range of the acoustic characteristic inside the vehicle. Therefore, the difference in acoustic characteristic between different kinds of vehicles can be readily corrected by the variable correcting means. In addition, since the variable correcting means is simple in circuitry, the mobile sound field correcting system of the invention can be manufactured at a relatively low cost.

Furthermore, according to the invention, the loudspeakers are installed in such a manner that their central axis is inclined in a range of about 30° to 90° with respect to the predetermined listening point in the vehicle sound field. Therefore, sound diffusion in the sound field is improved, and the spectrum of the sound reaching the ears of the listeners approaches the loudspeaker's power response. Furthermore, the power response is corrected by the correcting means in the drive system. Therefore, the mobile sound field correcting system of the invention yields a substantially flat frequency characteristic, even when the listening point is displaced.

As is further apparent from the above description, according to the invention, delay means are provided in the drive systems of the front and rear loudspeakers, and each delay means is adapted to adjust the time and the phase of the original signal to provide an output signal and to superpose the output signal on the original signal so that the acoustic characteristics of the front and rear loudspeakers are adjusted individually. Therefore, sound field correction can be achieved according to the listening position in the vehicle. Accordingly, the mobile sound field correcting system of the invention provides a satisfactory acoustic characteristic both for the front seat and for the rear seat.

Yet further according to the invention, in a vehicle in which the front and rear loudspeakers are installed respectively for the front and rear seats, the low-frequency acoustic characteristics of the rear loudspeakers are de-emphasized so that a person on the front seat hears the low-frequency components reproduced by the front loudspeakers. Therefore, at the rear seat, the low-frequency sound is not abnormally emphasized. Accordingly, the mobile sound field correcting system of the invention provides a satisfactory acoustic characteristic both for the front seat and for the rear seat.

We claim:

1. A mobile sound field correcting system for correcting an acoustic characteristic in a vehicle sound field formed by direct waves radiated from loudspeakers and reflected waves thereof, comprising:
   first correcting means for correcting a power spectrum of each loudspeaker in a frequency range higher than a frequency at which a decrease of said power spectrum in a high-frequency range of each loudspeaker starts; and
   second correcting means for correcting irregularities in a frequency characteristic of said loudspeaker caused by interference of said direct waves with said reflected waves in a frequency range lower than said frequency.

2. The system as claimed in claim 1, wherein said second correcting means comprises:
   means for adjusting a level and delay of an original signal; and
   means for superposing an output signal of said adjusting means on said original signal to provide an output signal applied to said loudspeaker.

3. A mobile sound field correcting system for correcting an acoustic characteristic in a vehicle sound field formed by direct waves radiated from loudspeakers and reflected waves thereof, comprising:
   first correcting means for correcting a power spectrum of each loudspeaker in a frequency range higher than a frequency at which a decrease of said power spectrum in a high-frequency range of each loudspeaker starts;
   second correcting means for correcting irregularities in a frequency characteristic caused by interference of said direct waves with said reflected waves in a frequency range lower than said frequency; and
   third correcting means including at least one of number-of-passengers correction means for correcting an output characteristic of said loudspeaker according to variations in a number of persons in the vehicle and masking correcting means for correcting sound masking phenomenon caused by ambient travel noise of said vehicle.

4. The system as claimed in claim 3, wherein said second correcting means comprises: means for adjusting a level and delay of an original signal; and means for superposing an output signal of said adjusting means on said original signal to provide an output signal applied said loudspeaker.

5. The system as claimed in claim 3, wherein said loudspeakers are arranged in a four-loudspeaker arrangement including one pair of loudspeakers on right and left sides of a front seat of said vehicle and another pair of loudspeakers on right and left sides of a rear seat of said vehicle, and wherein said number-of-passengers correcting means increases a sound pressure level in a high-frequency range of said loudspeakers provided for said front seat when a plurality of persons are seated on said front seat.

6. The system as claimed in claim 5, wherein said pair of loudspeakers provided for said rear seat are installed on a parcel tray, and said number-of-passengers correction means comprises means for making output levels of said pair of loudspeakers equal to each other when a plurality of persons are seated on said rear seat and decreasing, when a single person is seated said rear seat, an ouput level of a loudspeaker closer to said person.

7. A mobile sound field correcting system, comprising means for correcting a power spectrum of each loudspeaker installed in a vehicle in a frequency range higher than a frequency at which a decrease of said power spectrum starts in a high-frequency range of said loudspeaker, said correcting means comprising:
   first means having a fixed correction characteristic determined according to an intrinsic characteristic of said loudspeaker; and
   second means having a variable correction characteristic, said second means correcting variation in an acoustic characteristic for different vehicles.

8. A mobile sound field correcting system comprising:
   a plurality of loudspeakers installed inside a vehicle; and
   correcting means for correcting a power spectrum of each of said loudspeakers in a frequency range higher than a frequency at which a decrease of said power spectrum starts, said loudspeakers having a central axis inclined in a range of about 30° to 90° with respect to a predetermined listening point in a vehicle sound field.

9. In a mobile sound field correcting system for correcting an acoustic field in a vehicle sound field formed by direct waves radiated from front and rear loudspeakers provided respectively for front and rear seats in vehicle and reflected waves thereof, the improvement comprising:
   a pair of delay means provided respectively in drive systems for said front and rear loudspeakers, each delay means adjusting a time and delay of an original signal to provide an output signal and superposing said output signal on said original signal, said pair of delay means thereby adjusting acoustic characteristics of said front and rear loudspeakers individually.

10. In a mobile sound field correcting system for correcting an acoustic characteristic in a vehicle sound field formed by direct waves radiated from front and rear seats in a vehicle and reflected waves thereof, the improvement wherein low-frequency acoustic characteristics of said rear loudspeakers are attenuated.

11. The system as claimed in claim 10, where the improvement further comprises a low-frequency range loudspeaker added to said front and rear loudspeakers, a crossover frequency of said low-frequency range loudspeaker and said front and rear loudspeakers being determined by said front loudspeakers and said low-frequency range loudspeaker.

* * * * *